United States Patent
Chan et al.

(10) Patent No.: US 8,368,112 B2
(45) Date of Patent: Feb. 5, 2013

(54) ALIGNED MULTIPLE EMITTER PACKAGE

(75) Inventors: Chi Keung Alex Chan, Hong Kong (CN); Yue Kwong Victor Lau, Hong Kong (CN); Xuan Wang, Guangdong (CN); David Emerson, Chapel Hill, NC (US)

(73) Assignee: Cree Huizhou Opto Limited, Huizhou Municipality, Guangdong Province (CN)

( * ) Notice: Subject to any disclaimer, the term of this patent is extended or adjusted under 35 U.S.C. 154(b) by 0 days.

(21) Appl. No.: 12/321,059

(22) Filed: Jan. 14, 2009

(65) Prior Publication Data

US 2010/0155748 A1    Jun. 24, 2010

(51) Int. Cl.
*H01L 33/62* (2010.01)
(52) U.S. Cl. ............ 257/99; 257/89; 257/666; 257/692; 257/707; 257/E23.052; 257/E33.066
(58) Field of Classification Search ............. 257/81, 257/84, 88–90, 95, 98–100
See application file for complete search history.

(56) References Cited

U.S. PATENT DOCUMENTS

| | | | |
|---|---|---|---|
| 3,760,237 A | 9/1973 | Jaffe | ............................ 257/98 |
| 4,307,297 A | 12/1981 | Groff | |
| 4,511,425 A | 4/1985 | Boyd | ......................... 156/493 |
| 4,946,547 A | 8/1990 | Palmour et al. | ............. 156/643 |
| 5,040,868 A | 8/1991 | Waitl | |
| 5,122,943 A | 6/1992 | Pugh | ......................... 362/256 |
| 5,130,761 A | 7/1992 | Tanaka | ......................... 357/17 |
| 5,167,556 A | 12/1992 | Stein | |
| 5,200,022 A | 4/1993 | Kong et al. | ................... 156/612 |
| 5,351,106 A | 9/1994 | Lesko et al. | ................... 355/83 |
| RE34,861 E | 2/1995 | Davis et al. | ................. 437/100 |
| 5,703,401 A | 12/1997 | Van de Water | |

(Continued)

FOREIGN PATENT DOCUMENTS

| | | |
|---|---|---|
| CN | 1417868 A | 5/2003 |
| CN | 2617039 Y | 5/2004 |

(Continued)

OTHER PUBLICATIONS

Office Action from related China Application No. 200710142310.7, dated: Dec. 11, 2009.

(Continued)

*Primary Examiner* — Ha Tran T Nguyen
*Assistant Examiner* — Raj R Gupta
(74) *Attorney, Agent, or Firm* — Koppel, Patrick, Heybl & Philpott

(57) ABSTRACT

A multiple element emitter package is disclosed for increasing color fidelity and heat dissipation, improving current control, increasing rigidity of the package assembly. In one embodiment, the package comprises a surface-mount device casing with a cavity extending into the interior of the casing from a first main surface is provided. A lead frame is at least partially encased by the casing, the lead frame comprising a plurality of electrically conductive parts carrying a linear array of light emitting devices (LEDs). Electrically conductive parts, separate from parts carrying the LEDs have a connection pad, wherein the LEDs are electrically coupled to a connection pad, such as by a wire bond. This lead frame arrangement allows for a respective electrical signal can be applied to each of the LEDs. The emitter package may be substantially waterproof, and an array of the emitter packages may be used in an LED display such as an indoor and/or outdoor LED screen.

11 Claims, 6 Drawing Sheets

U.S. PATENT DOCUMENTS

| | | | | |
|---|---|---|---|---|
| 5,706,177 | A | 1/1998 | Nather | |
| 5,790,298 | A | 8/1998 | Tonar | 359/267 |
| 5,813,753 | A | 9/1998 | Vriens et al. | 362/293 |
| 5,907,151 | A | 5/1999 | Gramann | |
| 5,959,316 | A | 9/1999 | Lowery | 257/98 |
| 6,061,160 | A | 5/2000 | Maruyama | 359/152 |
| 6,066,861 | A | 5/2000 | Hohn et al. | |
| 6,183,100 | B1 | 2/2001 | Suckow et al. | 362/35 |
| 6,224,216 | B1 | 5/2001 | Parker et al. | 353/31 |
| 6,259,608 | B1 | 7/2001 | Berardinelli et al. | 361/777 |
| 6,274,924 | B1 | 8/2001 | Carey et al. | 257/676 |
| 6,296,367 | B1 | 10/2001 | Parsons et al. | 362/183 |
| 6,359,236 | B1 | 3/2002 | DiStefano et al. | 374/261 |
| 6,376,902 | B1 | 4/2002 | Arndt | 257/678 |
| 6,454,437 | B1 | 9/2002 | Kelly | 362/246 |
| 6,469,321 | B2 | 10/2002 | Arndt | |
| 6,480,389 | B1 | 11/2002 | Shie et al. | 361/707 |
| 6,517,218 | B2 | 2/2003 | Hochstein | 362/294 |
| 6,536,913 | B1 | 3/2003 | Yajima | |
| 6,573,580 | B2 | 6/2003 | Arndt | |
| 6,610,563 | B1 | 8/2003 | Waitl et al. | |
| 6,614,058 | B2 | 9/2003 | Lin et al. | |
| 6,624,491 | B2 | 9/2003 | Waitl et al. | |
| 6,680,490 | B2 | 1/2004 | Yasukawa et al. | |
| 6,686,609 | B1 | 2/2004 | Sung | |
| 6,707,069 | B2 | 3/2004 | Song et al. | 257/79 |
| 6,710,373 | B2 | 3/2004 | Wang | 257/79 |
| 6,759,733 | B2 | 7/2004 | Arndt | |
| 6,770,498 | B2 | 8/2004 | Hsu | 438/26 |
| 6,774,401 | B2 | 8/2004 | Nakada et al. | |
| 6,858,879 | B2 | 2/2005 | Waitl | |
| 6,872,585 | B2 | 3/2005 | Matsumura et al. | |
| 6,876,149 | B2 | 4/2005 | Miyashita | |
| 6,900,511 | B2 | 5/2005 | Ruhnau et al. | |
| 6,911,678 | B2 | 6/2005 | Fujisawa et al. | |
| 6,919,586 | B2 | 7/2005 | Fujii | |
| 6,940,704 | B2 | 9/2005 | Stalions | |
| 6,946,714 | B2 | 9/2005 | Waitl | |
| 6,975,011 | B2 | 12/2005 | Arndt et al. | |
| 6,995,510 | B2 | 2/2006 | Murakami et al. | |
| 7,009,285 | B2 | 3/2006 | Su et al. | 257/680 |
| 7,009,627 | B2 | 3/2006 | Abe et al. | 345/690 |
| 7,021,797 | B2 | 4/2006 | Minano et al. | 362/355 |
| 7,064,907 | B2 | 6/2006 | Kaneko | |
| 7,066,626 | B2 | 6/2006 | Omata | |
| 7,102,213 | B2 | 9/2006 | Sorg | |
| 7,102,215 | B2 | 9/2006 | Arndt | 257/672 |
| 7,119,422 | B2 | 10/2006 | Chin | 257/666 |
| 7,161,189 | B2 | 1/2007 | Wu | 257/98 |
| 7,183,632 | B2 | 2/2007 | Arndt | 257/672 |
| 7,224,000 | B2 | 5/2007 | Aanegola et al. | 257/98 |
| 7,271,425 | B2 | 9/2007 | Arndt et al. | 257/99 |
| 7,282,740 | B2 | 10/2007 | Chikugawa et al. | 257/79 |
| 7,282,765 | B2 | 10/2007 | Yoshida | 257/766 |
| 7,285,802 | B2 | 10/2007 | Ouderkirk et al. | 257/98 |
| 7,317,181 | B2 | 1/2008 | Murakami et al. | 250/214.1 |
| D572,210 | S | 7/2008 | Lee | D13/180 |
| D572,670 | S | 7/2008 | Ono et al. | D13/180 |
| D576,574 | S | 9/2008 | Kobayakawa | D13/180 |
| 7,436,002 | B2 | 10/2008 | Brunner et al. | 257/99 |
| 7,635,915 | B2 | 12/2009 | Xie et al. | 257/692 |
| 7,777,412 | B2 | 8/2010 | Pang | 313/506 |
| 2002/0030194 | A1 | 3/2002 | Camras et al. | |
| 2002/0061174 | A1 | 5/2002 | Hurt et al. | |
| 2002/0066905 | A1 | 6/2002 | Wang | |
| 2002/0123163 | A1 | 9/2002 | Fujii | |
| 2002/0130405 | A1 | 9/2002 | Kobayashi et al. | |
| 2002/0163001 | A1 | 11/2002 | Shaddock | |
| 2002/0195935 | A1 | 12/2002 | Jager | |
| 2003/0116769 | A1 | 6/2003 | Song et al. | |
| 2003/0183852 | A1 | 10/2003 | Takenaka | |
| 2004/0041222 | A1* | 3/2004 | Loh | 257/433 |
| 2004/0047151 | A1 | 3/2004 | Bogner et al. | |
| 2004/0079957 | A1 | 4/2004 | Andrews et al. | |
| 2004/0080939 | A1 | 4/2004 | Braddell et al. | |
| 2004/0126913 | A1 | 7/2004 | Loh | |
| 2004/0201028 | A1 | 10/2004 | Waitl | |
| 2004/0227149 | A1 | 11/2004 | Ibbetson | |
| 2004/0232435 | A1 | 11/2004 | Hofer | |
| 2004/0238930 | A1 | 12/2004 | Arndt | |
| 2004/0256706 | A1 | 12/2004 | Nakashima | |
| 2005/0023548 | A1 | 2/2005 | Bhat | |
| 2005/0072981 | A1 | 4/2005 | Suenaga | |
| 2005/0077535 | A1 | 4/2005 | Li | |
| 2005/0093005 | A1 | 5/2005 | Ruhnau | |
| 2005/0117320 | A1 | 6/2005 | Leu et al. | |
| 2005/0127377 | A1 | 6/2005 | Arndt | |
| 2005/0135105 | A1 | 6/2005 | Teixeira et al. | |
| 2005/0152127 | A1 | 7/2005 | Kamiya et al. | |
| 2005/0156187 | A1 | 7/2005 | Isokawa | |
| 2005/0179041 | A1 | 8/2005 | Harbers et al. | |
| 2005/0179376 | A1 | 8/2005 | Fung et al. | |
| 2006/0022212 | A1 | 2/2006 | Waitl | |
| 2006/0049477 | A1 | 3/2006 | Arndt et al. | |
| 2006/0091406 | A1* | 5/2006 | Kaneko et al. | 257/81 |
| 2006/0102917 | A1 | 5/2006 | Oyama et al. | |
| 2006/0108594 | A1 | 5/2006 | Iwasaki et al. | |
| 2006/0133044 | A1 | 6/2006 | Kim et al. | |
| 2006/0157828 | A1 | 7/2006 | Sorg | |
| 2006/0220046 | A1 | 10/2006 | Yu et al. | |
| 2007/0046176 | A1 | 3/2007 | Bukesov et al. | |
| 2007/0070530 | A1 | 3/2007 | Seo et al. | |
| 2007/0109779 | A1* | 5/2007 | Sekiguchi et al. | 362/249 |
| 2007/0170449 | A1 | 7/2007 | Anandan | |
| 2007/0252250 | A1 | 11/2007 | Hui et al. | |
| 2007/0269586 | A1 | 11/2007 | Leatherdale | |
| 2008/0013319 | A1 | 1/2008 | Pei et al. | |
| 2008/0074032 | A1 | 3/2008 | Yano et al. | |
| 2008/0121921 | A1 | 5/2008 | Loh et al. | |
| 2008/0186702 | A1 | 8/2008 | Camras et al. | |
| 2008/0191232 | A1 | 8/2008 | Lee et al. | |
| 2008/0296590 | A1 | 12/2008 | Ng | |
| 2008/0303052 | A1 | 12/2008 | Lee et al. | |
| 2009/0050908 | A1 | 2/2009 | Yuan et al. | |
| 2009/0072251 | A1* | 3/2009 | Chan et al. | 257/89 |
| 2009/0129085 | A1* | 5/2009 | Aizar et al. | 362/247 |
| 2009/0189178 | A1 | 7/2009 | Kim et al. | |
| 2009/0283781 | A1* | 11/2009 | Chan et al. | 257/89 |
| 2011/0049545 | A1 | 3/2011 | Basin et al. | |

FOREIGN PATENT DOCUMENTS

| | | | |
|---|---|---|---|
| CN | 1581527 | A | 2/2005 |
| CN | 1591924 | A | 3/2005 |
| CN | 1679168 | A | 10/2005 |
| CN | 1744335 | A | 3/2006 |
| CN | 1977399 | A | 6/2007 |
| CN | 101360368 | | 2/2009 |
| DE | WO9931737 | | 6/1999 |
| DE | WO2004027882 | | 4/2004 |
| EP | 1005085 | A2 | 5/2000 |
| EP | 1005085 | A3 | 12/2000 |
| EP | 1187226 | | 3/2002 |
| EP | 1187227 | | 3/2002 |
| EP | 1187228 | | 3/2002 |
| EP | 1 418 630 | A1 | 5/2004 |
| EP | 1521313 | | 4/2005 |
| EP | 1 538 680 | A2 | 6/2005 |
| EP | 1 953 834 | A1 | 8/2008 |
| GB | 2420221 | A | 12/2004 |
| GB | 2420221 | A | 5/2006 |
| GB | 2 458 972 | A | 10/2009 |
| JP | 53-118019 | | 10/1978 |
| JP | 59-027559 | A | 2/1984 |
| JP | 59-27559 | A | 2/1984 |
| JP | 59027559 | | 2/1984 |
| JP | 61-048951 | A | 3/1986 |
| JP | 61-48951 | A | 3/1986 |
| JP | 61048951 | | 3/1986 |
| JP | 7-202271 | A | 8/1995 |
| JP | 8139257 | | 5/1996 |
| JP | 11008405 | | 1/1999 |
| JP | 11-054802 | | 2/1999 |
| JP | 11150306 | | 6/1999 |
| JP | 11261113 | | 9/1999 |
| JP | 2000-188358 | | 7/2000 |
| JP | 2000-223751 | | 8/2000 |
| JP | 2001044506 | | 2/2001 |

| | | |
|---|---|---|
| JP | 2001-168400 | 6/2001 |
| JP | 2001518692 | 10/2001 |
| JP | 2002-223005 | 8/2002 |
| JP | 2003-197974 | 7/2003 |
| JP | 2003-264267 | 9/2003 |
| JP | 2004-111937 A | 4/2004 |
| JP | 2004-200236 | 7/2004 |
| JP | 2005-19838 A | 1/2005 |
| JP | 2005-019838 A | 1/2005 |
| JP | 2005019838 | 1/2005 |
| JP | 2005-079167 | 3/2005 |
| JP | 2005150624 | 6/2005 |
| JP | 2005-310935 | 11/2005 |
| JP | 2006509372 A | 3/2006 |
| JP | 2006-119357 | 5/2006 |
| JP | 2007-094088 | 4/2007 |
| JP | 2007-95797 A | 4/2007 |
| JP | 2007-165029 | 6/2007 |
| JP | 2000223752 | 8/2008 |
| WO | WO 0217405 | 2/2002 |
| WO | WO 2004044877 | 5/2004 |
| WO | WO 2004/053933 A2 | 6/2004 |
| WO | WO 2005043627 A1 | 5/2005 |
| WO | WO 2005104247 | 11/2005 |
| WO | WO 2006054228 A2 | 5/2006 |
| WO | WO 2006054228 A3 | 5/2006 |
| WO | WO2007/127029 A2 | 11/2007 |

OTHER PUBLICATIONS

Related U.S. Appl. No. 11/473,089, filed Jun. 21, 2006, "Close Loop Electrophoretic Deposition of Semiconductor Devices".
U.S. Appl. No. 11/380,402, filed Apr. 26, 2006, Jian Hui Xie.
Nichia Corp. White LED Part No. NSPW300BS, Specification for Nichia White LED , Model NSPW300BS., Jan. 14, 2004.
Nicha Corp., White LED Part No. NSPW312BS, Specification for Nichia White LED, Model NSPW312BS. Jan. 14, 2004.
Kim J.K et al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 XP-001236966, pp. 649-651.
Preliminary Notice of Reasons for Refusal re related Japanese Application No. 2009-009-002857, dated: Jul. 24, 2009.
Related PCT International Search Report and Written Opinion, PCT/IB2007/002432, Date: Jan. 11, 2008.
Japanese Patent Application 2001-60072, dated: Mar. 6, 2001.
Related Office Action from U.S. Appl. No. 11/277,717, dated: Jan. 6, 2009.
Related Office Action from related U.S. Appl. No. 11/277,717, dated Jul. 27, 2009.
International Search Report and Written Opinion for counterpart application PCT/CN2010/070073 mailed Apr. 15, 2010.
Office Action from U.S. Appl. No. 11/149,998. dated: Nov. 20, 2009.
Response to Office Action from U.S. Appl. No. 11/149,998, dated: Feb. 22, 2010.
Office Action from U.S. Appl. No. 12/154,691. dated: Dec. 17, 2009.
Response to Office Action from U.S. Appl. No. 12/154,691. dated: May 17, 2010.
Office Action from U.S. Appl. No. 11/465,120. dated: Mar. 9, 2010.
Office Action from U.S. Appl. No. 12/152,766. dated: Mar. 12, 2010.
Office Action from U.S. Appl. No. 12/069,827. dated: Apr. 20, 2010.
Office Action from U.S. Appl. No. 11/149,998, dated: May 18, 2010.
CREE® XLAMP® MC-E LEDS Product Info Sheets, p. 1-3.
Nichia Corporation LEDS, Models NSSM016G, NSSM227, NESM026X, NSSM026BB, NESM005A, 9 Pages.
Office Action in related U.S. Appl. No. 12/002,410, dated: Apr. 26, 2011.
Office Action in related U.S. Appl. No. 12/002,410, dated: May 25, 2010.
Office Action in related U.S. Appl. No. 12/002,410, dated: Dec. 13, 2010.
Office Action in related U.S. Appl.. No. 11/149,998, dated: May 11, 2011.
Office Action in related U.S. Appl. No. 11/149,998, dated: Aug. 27, 2010.
Office Action in related U.S. Appl. No. 11/149,998, dated: Jan. 24, 2011.
Office Action in related U.S. Appl. No. 11/149,998, dated: Nov. 20, 2009.
Response to OA in related U.S. Appl. No. 11/149,998, dated: Nov. 20, 2009, Response filed: Feb. 22, 2010.
Office Action in related U.S. Appl. No. 11/149,998, dated: May 18, 2010.
Office Action in related U.S. Appl. No. 12/291,293, dated: May 27, 2010.
Office Action in related U.S. Appl. No. 12/291,293, dated: Sep. 3, 2010.
Office Action in related U.S. Appl. No. 12/291,293, dated: Mar. 1, 2011.
Office Action in related U.S. Appl. No. 11/496,922, dated: Jun. 10, 2010.
Office Action in related U.S. Appl. No. 11/496,922, dated: Dec. 15, 2010.
Office Action in related U.S. Appl. No. 12/152,766, dated: Oct. 7, 2010.
Office Action in related U.S. Appl. No. 12/152,766, dated: Apr. 1, 2011.
Office Action in related U.S. Appl. No. 12/152,766, dated: Mar. 12, 2010.
Office Action in related U.S. Appl. No. 11/465,120, dated: Sep. 8, 2010.
Office Action in related U.S. Appl. No. 11/465,120, dated: Dec. 13, 2010.
Office Action in related U.S. Appl. No. 11/465,120, dated: Mar. 9, 2010.
Office Action in related U.S. Appl. No. 12/635,818, dated: Oct. 14, 2010.
Office Action in related U.S. Appl. No. 12/695,978, dated: Dec. 20, 2010.
Office Action in related U.S. Appl. No. 12/695,978, dated: May 10, 2011.
Office Action in related U.S. Appl. No. 12/069,827, dated: Oct. 29, 2010.
Office Action in related U.S. Appl. No. 12/069,827, dated: Apr. 20, 2010.
Office Action in related U.S. Appl. No. 12/069,827, dated: Jan. 27, 2011.
Office Action in related U.S. Appl. No. 12/154,691, dated: Dec. 17, 2009.
Response to OA in related U.S. Appl. No. 12/154,691, dated: Dec. 17, 2009, Response filed: May 17, 2010.
Notice of Reasons for Rejection for Japanese Patent Application No. 2007-211901 dated Apr. 14, 2011.
International Preliminary Report on Patentability for PCT/CN2010/070073 mailed Apr. 28, 2011.
International Search Report and Written Opinion for PCT/CN2010/001865 mailed Jun. 9, 2011.
Notice of Reasons for Rejection for Japanese Patent Application No. JP 2008-515699 dated May 19, 2011.
Notice of Reasons for Rejection for Japanese Patent Application No. JP 2009-507195 dated Jun. 10, 2011.
Notice of Reasons for Rejection for Japanese Patent Application No. JP 2008-281533 dated Jun. 24, 2011.
Office Action from U.S. Appl. No. 12/291,293, dated: Jul. 19, 2011.
Response to Office Action from U.S. Appl. No. 12/291,293, OA dated: Jul. 19, 2011, Resp. dated: Oct. 19, 2011.
Office Action from U.S. Appl. No. 11/465,120, dated: Jun. 14, 2011.
Office Action from U.S. Appl. No. 12/069,827, dated: Jun. 16, 2011.
Response to Office Action from U.S. Appl. No. 12/069,827, OA dated: Jul. 16, 2011, Reap. dated: Aug. 3, 2011.
Office Action from U.S. Appl. No. 11/496,922, dated: Jul. 5, 2011.
Office Action from U.S. Appl. No. 12/695,978, dated: Sep. 14, 2011.
Office Action from U.S. Appl. No. 11/149,998, dated: Sep. 21, 2011.
Office Action from U.S. Appl. No. 12/069,827, dated: Oct. 26, 2011.
Notice of Reasons for Rejection from Japanese Patent Application No. 2009-507195, dated May 8, 2012.

First Office Action for Chinese Patent Application No. 200980153995.2 . dated May 4, 2012.
First Office Action for Chinese Patent Application No. 200910145412.3. dated Apr. 28, 2012.
First Office Action for Chinese Patent Application No. 201110039138.9, dated Jun. 4, 2012.
Decision of Rejection from Japanese Patent Application No. 2008-515699, dated Jul. 17, 2012.
First Office Action for Chinese Patent Application No. CN 200710152109.7 issued Jul. 29, 2011.
Extended Supplementary European Search Report for EP Application No. EP 07789665.2 dated Nov. 7, 2011.
Second Office Action for Chinese Patent Application No. CN200880009255.7 mailed Oct. 13, 2011.
International Search Report and Written Opinion for PCT Application No. PCT/US2011/001457 mailed Dec. 13, 2011.
Decision of Rejection for Japanese Patent Application No. 2007-211901, dated: Jan. 30, 2012.
Notification of the First Office Action from Chinese Patent Application No. 201010167346.2, dated Feb. 29, 2012.
Office Action from U.S. Appl. No. 11/465,120, mailed Dec. 9, 2011.
Office Action from U.S. Appl. No. 12/002,410, mailed Mar. 28, 2012.
Office Action from U.S. Appl. No. 12/002,410, mailed Dec. 21, 2011.
Response to Office Action for U.S. Appl. No. 12/002,410, filed Mar. 8, 2012.
Office Action from U.S. Appl. No. 12/757,179, mailed Jan. 19, 2012.
Office Action from U.S. Appl. No. 11/496,922, mailed Feb. 9, 2012.
Response to Office Action for U.S. Appl. No. 11/496,922, filed Apr. 6, 2012.
Advisory Action for U.S. Appl. No. 11/496,922, mailed Apr. 18, 2012.
Office Action from U.S. Appl. No. 12/695,978, mailed Mar. 14, 2012.
Office Action from U.S. Appl. No. 11/982,275, mailed Mar. 23, 2012.
Office Action from U.S. Appl. No. 12/614,989, mailed Mar. 12, 2012.
Office Action from U.S. Appl. No. 12/069,827, mailed Apr. 3, 2012.
Interrogation from Japanese Patent Application No. 2007-211901, dated Aug. 21, 2012.
Examination Report from European Patent Application No. 07789665.2. dated Aug. 20, 2012.
Decision of Rejection from Chinese Patent Application No. 200880009255.7, dated Sep. 5, 2012.
First Office Action from Chinese Patent Application No. 201080001658.4, dated Sep. 24, 2012.

* cited by examiner

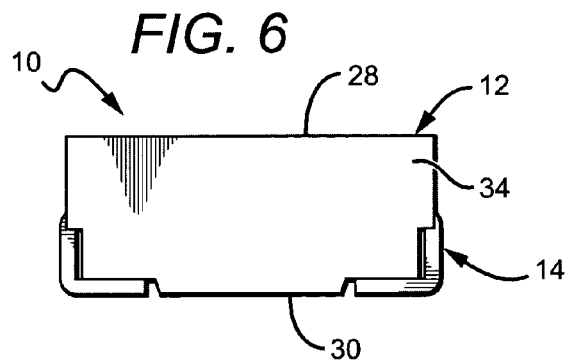
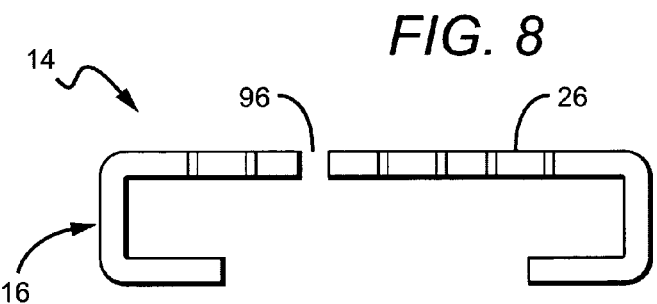
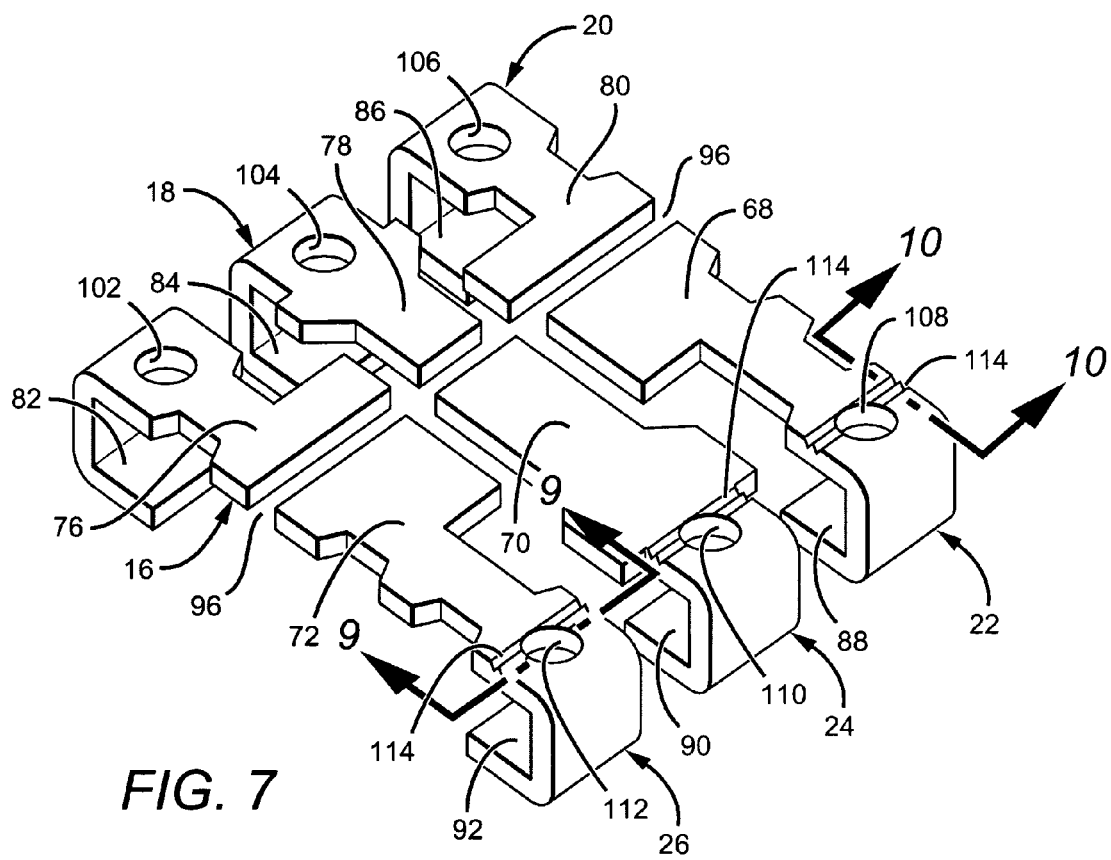

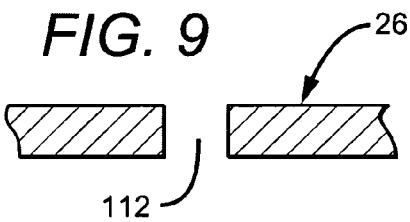
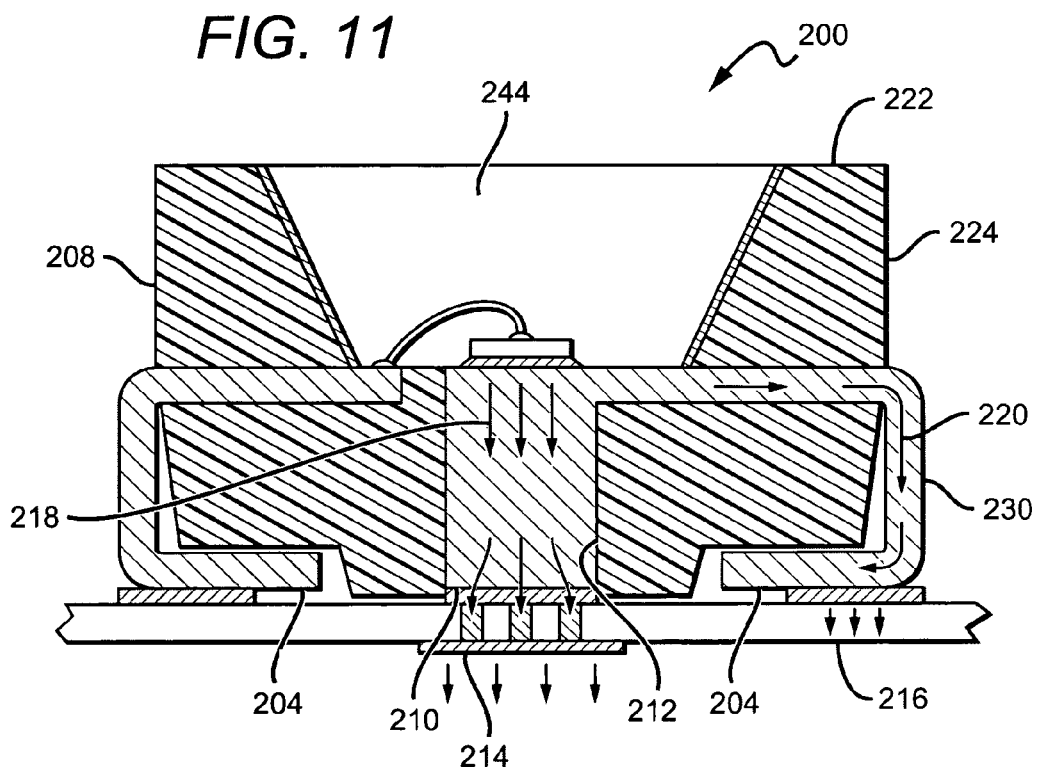
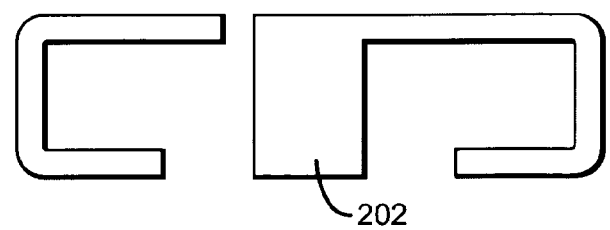

ALIGNED MULTIPLE EMITTER PACKAGE

BACKGROUND OF THE INVENTION

1. Field of the Invention

The present invention relates generally to multi emitter packages, and more particularly to surface mount packages having multiple emitters that are aligned to improve emission uniformity.

2. Description of the Related Art

In recent years, there have been dramatic improvements in light emitting diode (LED) technology such that LEDs of increased brightness and color fidelity have been introduced. Due to these improved LEDs and improved image processing technology, large format, full color LED video screens have become available and are now in common use. Large format LED displays typically comprise a combination of individual LED panels providing image resolutions determined by the distance between adjacent pixels or "pixel pitch".

Outdoor display that may be intended for viewing from greater distances, can have relatively large pixel pitches and usually comprise discrete LED arrays. In the discrete LED arrays, a cluster of individually mounted red, green, and blue LEDs are driven to form what appears to the viewer as a full color pixel. On the other hand, indoor screens, which require shorter pixel pitches such as 3 mm or less, can comprise panels having a plurality of surface mount devices (SMD or SMDs) or other types of emitter packages, each of which defines a pixel. Each emitter package can carry red, green, and blue emitting LEDs whose emitted light combines to generate the desired wavelength or color of light.

Both indoor and outdoor displays are typically viewable across a substantial range of off-axis angles, such as up to 145° or even greater. The LEDs in some conventional emitter packages suffer from different emission characteristics at different viewing angles. The LEDs in these packages can be arranged in a cluster at or near the center of the package, and at different viewing angles the particular LED closest to the viewer may emit more prominently. For example, if the package were viewed at an angle such that the red LED was closest to the viewer, the red may emit more prominently than when the package is viewed directly. The same could be true for the blue and green LEDs. As a result, the color generated by the packages can be perceived as different depending on the viewing angle.

Conventional emitter packages can also suffer from a perceptible loss of color fidelity with increasing viewing angle. Additionally, the material of each emitter package and/or the material used to mount each of the LEDs within the packages may have reflective characteristics, which can further decrease color fidelity by creating unwanted light reflection and/or glare.

Emitter packages such as SMDs, whether containing integrated circuits or discrete components such as diodes or power transistors, can generate significant heat, particularly in high power devices. This heat typically needs to be dissipated to prevent premature component degradation or failure. This can require additional thermal management component to dissipate sufficient heat to maintain the operating temperature of the active circuit or junction side of the component below a target temperature (for example, 110° C. or below). Various thermal management strategies including conduction heat transfer are in common use. One conventional way of implementing conduction heat transfer for dissipating heat in an electronic package is to allow the heat to conduct away along the leads of the device. However, the leads often do not have sufficient mass or exposed surface area to provide effective heat dissipation. For example, high intensity LEDs that emit light principally in the visible part of the electromagnetic spectrum can generate significant amounts of heat that is difficult to dissipate using such conventional techniques.

SUMMARY OF THE INVENTION

The present invention provides emitter package lead frames, emitter packages and LED screens that provide for improved color emission uniformity at different viewing angles. The present invention also provides emitter packages with that allow for improved current control of the emitters in the packages, rigidity of the package assembly, and waterproof package operation.

One embodiment of an electrically conductive lead frame for a multiple emitter package comprising a plurality of electrically conductive cathode parts each having an attach pad for carrying at least one light emitting device with each attach pad electrically coupled to its at least one light emitting device. A corresponding plurality of electrically conductive anode parts are included separate from each the cathode parts, each of said anode parts having a connection pad arranged to allow electrical connection to a light emitting device. Wherein the attach pads and connection pads are arranged to hold light emitting devices in linear alignment.

One embodiment of an emitter package according to the present invention comprises a casing having a cavity extending into the interior of the casing from the casing's top surface. A lead frame is included that is integral to the casing with the lead frame comprising conductive parts holding a plurality of light emitting devices in linear alignment and emitting out said cavity. The lead frame also allows for an electrical signal to be applied to the light emitting devices through the lead frame.

One embodiment of a light emitting device display according to the present invention comprises a substrate carrying an array of emitter packages. Each of the emitter packages comprises a casing and contains linearly aligned light emitting devices. Electrically connected drive circuitry is included to selectively energize the array of emitter packages for producing visual images on said display.

These and other further features and advantages of the invention would be apparent to those skilled in the art from the following detailed description, taken together with the accompanying drawings, in which:

BRIEF DESCRIPTION OF THE DRAWINGS

FIG. 5 is a left side elevation view of the embodiment shown in FIG. 1, with the right side being substantially similar;

FIG. 6 is a front side elevation view of the embodiment shown in FIG. 1, with the back side being substantially similar;

FIG. 7 is a perspective view of a lead frame in accordance with one embodiment that may be used in the device of FIG. 1;

FIG. 8 is a side elevation view of the lead frame shown in FIG. 7;

FIG. 9 is a sectional view of a lead frame in FIG. 8 taken along section lines 9-9 and showing a lead frame through hole;

FIG. 10 is a sectional view of a lead frame in FIG. 8 taken along section lines 10-10 and showing lead frame V-cuts;

FIG. 11 is a sectional view, along the lines of that shown in FIG. 3, of another embodiment of a surface mount device according to the present invention;

FIG. 13 is an end elevation view of the embodiment shown in FIG. 11;

FIG. 15 is a front side elevation view of the embodiment shown in FIG. 1, with the back side view being substantially similar;

DETAILED DESCRIPTION OF THE INVENTION

Figure 1:
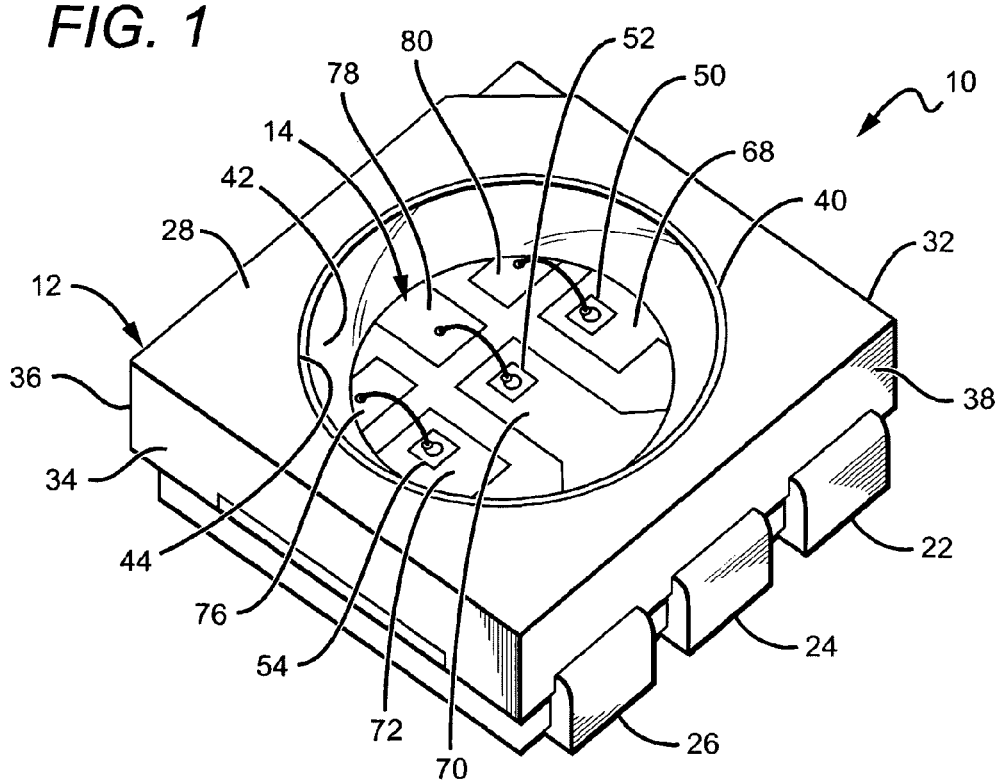
FIG. 1 is a perspective view of a surface mount device according to the present invention.

The present invention provides structures for multi emitter packages that allow the packages to emit light with improved color uniformity at different viewing by linearly aligning the emitters within the package. In one embodiment, the emitters are vertically aligned although it is understood that in different applications the emitters could be horizontally aligned or aligned at an angle. In some embodiments, the packages can also have lead frame structures that allow each of the emitters in the package to be driven by its own electrical signal. This allows for improved control over the color and intensity of light emitted by the emitter package.

In one embodiment of an emitter package according to the present invention the emitters can comprise red, green and blue emitters that are vertically aligned at or near the centerline of the package so that the viewing angles of the red, green and blue colors coincide with each other. This allows the color of the emitter package to appear more uniform at different viewing angles compared to prior art packages having emitters in a cluster. The emitter packages according to the present invention can also comprise a lead frame and casing that helps keep the package waterproof, and also comprises features to improve package rigidity, such as through holes.

The present invention is applicable to different types of emitter packages such as surface mount devices (SMDs) that can be used in many different lighting applications such as LED color screens or decorative lighting and applications where waterproof devices are desired. Different embodiments of emitter packages are described below that utilize light emitting diodes as their emitters, but it is understood that other emitter package embodiments can use different types of emitters.

It will be understood that when an element is referred to as being "on", "connected to", "coupled to" or "in contact with" another element, it can be directly on, connected or coupled to, or in contact with the other element or intervening elements may be present. In contrast, when an element is referred to as being "directly on," "directly connected to", "directly coupled to" or "directly in contact with" another element, there are no intervening elements present. Likewise, when a first element is referred to as being "in electrical contact with" or "electrically coupled to" a second element, there is an electrical path that permits current flow between the first element and the second element. The electrical path may include capacitors, coupled inductors, and/or other elements that permit current flow even without direct contact between conductive elements.

Although the terms first, second, etc. may be used herein to describe various elements, components, regions, and/or sections, these elements, components, regions, and/or sections should not be limited by these terms. These terms are only used to distinguish one element, component, region, or section from another element, component, region, or section. Thus, a first element, component, region, or section discussed below could be termed a second element, component, region, or section without departing from the teachings of the present invention.

Embodiments of the invention are described herein with reference to cross-sectional view illustrations that are schematic illustrations of embodiments of the invention. As such, the actual thickness of components can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

The following description presents preferred embodiments. This description is not to be taken in a limiting sense but is made merely for the purpose of describing the general principles of the invention, the scope of which is further understood by the appended claims.

FIGS. 1-8 show one embodiment of a multiple emitter package 10 according to the present invention that comprises a surface-mount device (SMD) 10. As mentioned above, it is understood that the present invention can be used with other types of emitter packages beyond SMDs. The package 10 comprises a casing 12 that carries an integral lead frame 14. The lead frame 14 comprising a plurality of electrically conductive connection parts used to conduct an electrical signals to the package's light emitters, and to also assist in dissipating heat generated by the emitters.

The lead frame 14 can be arranged in many different ways and different numbers of parts can be utilized in different package embodiments. The package 10 is described below utilizing three emitters, and in the embodiment shown, the lead frame is arranged so that each of the emitters is driven by a respective electrical signal. Accordingly there are six conductive parts in the embodiment shown, comprising a pair of conductive parts for each emitter with an electrical signal applied to each of the emitters through its conductive part pair. For the package 10, the conductive parts comprise first, second and third anode parts 16, 18, 20, and first, second and third cathode parts 22, 24, 26 (best shown in FIG. 7) each having an emitter attach pad.

The casing 12 can have many different shapes and sizes and in the embodiment shown is generally square or rectangular, with upper and lower surfaces 28 and 30, side surfaces 32 and 34 and end surfaces 36 and 38. The upper portion of the casing further comprises a recess or cavity 40 extending from the upper surface 28 into the body of the casing 12 to the lead frame 14. Emitters are arranged on the lead frame such that light from the emitters emits from the package 10 through the cavity 40. In some embodiments, a reflective insert or ring 42

Figure 15:
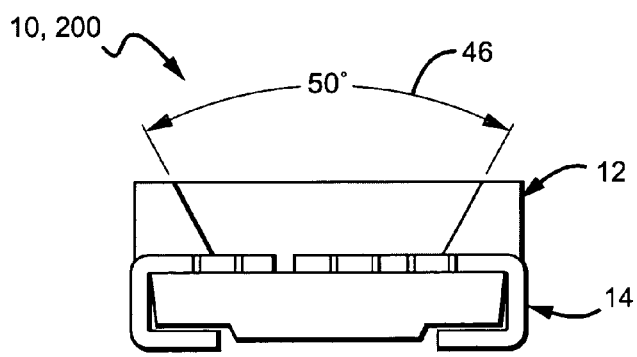

(shown in FIGS. 1-3) may be positioned and secured along at least a portion of a side or wall 44 of the cavity 40. The effectiveness of the reflectivity of the ring 42 and the emission angle of the package can be enhanced by tapering the cavity 40 and ring 42 carried therein inwardly toward the interior of the casing. By way of example and not by limitation and as best shown in FIG. 15, a reflector angle 46 of ~50 degrees provides for a suitable reflectivity and viewing angle.

In some embodiments, the cavity 40 may be at least partially filled with a fill material 48 that can protect and positionally stabilize the lead frame 14 and the emitters carried thereby. In some instances, the fill material 48 may cover the emitters and the portions of the lead frame 14 exposed through the cavity 40. The fill material 48 may be selected to have predetermined optical properties so as to enhance the projection of light from the LEDs, and in some embodiments is substantially transparent to the light emitted by the package's emitters. The fill material 48 can also be shaped, such as hemispheric or bullet shaped, or the fill material can be fully or partially concave in the cavity 40. The fill material 48 may be formed from a resin, an epoxy, a thermoplastic polycondensate, glass, and/or other suitable materials or combinations of materials. In some embodiments, materials may be added to the fill material 48 to enhance the emission, absorption and/or dispersion of light to and/or from the LEDs.

The casing 12 may be fabricated of material that is preferably both electrically insulating and thermally conductive. Such materials are well-known in the art and may include, without limitation, certain ceramics, resins, epoxies, thermoplastic polycondensates (e.g., a polyphthalamide (PPA)), and glass. In a preferred embodiment, the casing 12 may be formed of dark or black ceramic material(s) as they have been found to improve contrast in image generation SMD packages, such as with SMDs employed in video displays. The package 10 and its casing 12 may be formed and/or assembled through any one of a variety of known methods as is known in the art. For example, the casing 12 may be formed or molded around the anode parts 16, 18, 20 and cathode parts 22, 24, 26, such as by injection molding. Alternatively, the casing may be formed in sections, for example, top and bottom sections with the anode parts 16, 18, 20 and cathode parts 22, 24, 26 formed on the bottom section. The top and bottom sections can then be bonded together using know methods and materials, such as by an epoxy, adhesive or other suitable joinder material.

In the illustrative embodiment depicted, the package 10 utilizes first, second and third LEDs 50, 52, 54, each of which can emit the same color of light or different color of light than the others. In the embodiment shown, the LEDs 50, 52, 54 emit blue, green and red colors, respectively, so that when appropriately energized the LEDs produce in combination a substantially full range of colors. Further, when appropriately energized, the LEDs 50, 52, 54 emit a white light combination of different color temperatures.

LED structures, features, and their fabrication and operation are generally known in the art and only briefly discussed herein. LEDs can have many different semiconductor layers arranged in different ways and can emit different colors. The layers of the LEDs can be fabricated using known processes, with a suitable process being fabrication using metal organic chemical vapor deposition (MOCVD). The layers of the LED chips generally comprise an active layer/region sandwiched between first and second oppositely doped epitaxial layers, all of which are formed successively on a growth substrate or wafer. LED chips formed on a wafer can be singulated and used in different application, such as mounting in a package.

It is understood that the growth substrate/wafer can remain as part of the final singulated LED or the growth substrate can be fully or partially removed.

It is also understood that additional layers and elements can also be included in the LEDs, including but not limited to buffer, nucleation, contact and current spreading layers as well as light extraction layers and elements. The active region can comprise single quantum well (SQW), multiple quantum well (MQW), double heterostructure or super lattice structures.

The active region and doped layers may be fabricated from different material systems, with one such system being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP) or aluminum indium gallium phosphide (AlInGaP) or zinc oxide (ZnO).

The growth substrate/wafer can be made of many materials such as silicon, glass, sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

LEDs can also comprise additional features such as conductive current spreading structures, current spreading layers, and wire bond pads, all of which can be made of known materials deposited using known methods. Some or all of the LEDs can be coated with one or more phosphors, with the phosphors absorbing at least some of the LED light and emitting a different wavelength of light such that the LED emits a combination of light from the LED and the phosphor. LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively the LEDs can be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference. Furthermore, LEDs may have vertical or lateral geometry as is known in the art. Those comprising a vertical geometry may have a first contact on a substrate and a second contact on a p-type layer. An electrical signal applied to the first contact spreads into the n-type layer and a signal applied to the second contact spreads into a p-type layer. In the case of Group-III nitride devices, it is well known that a thin semitransparent typically covers some or the entire p-type layer. It is understood that the second contact can include such a layer, which is typically a metal such as platinum (Pt) or a transparent conductive oxide such as indium tin oxide (ITO).

LEDs may also comprise a lateral geometry, wherein both contacts are on the top of the LEDs. A portion of the p-type layer and active region is removed, such as by etching, to expose a contact mesa on the n-type layer. A second lateral n-type contact is provided on the mesa of the n-type layer. The contacts can comprise known materials deposited using known deposition techniques.

Figure 3:
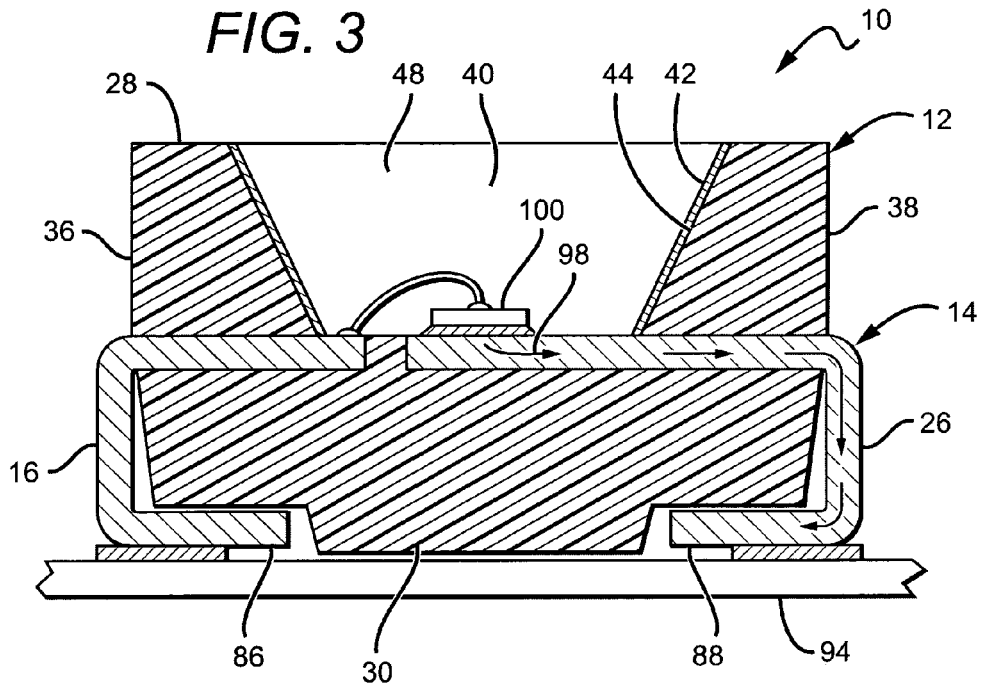
FIG. 3 is a sectional view of the embodiment of FIG. 1 as seen along the line 3-3 in FIG. 2.
Figure 4:
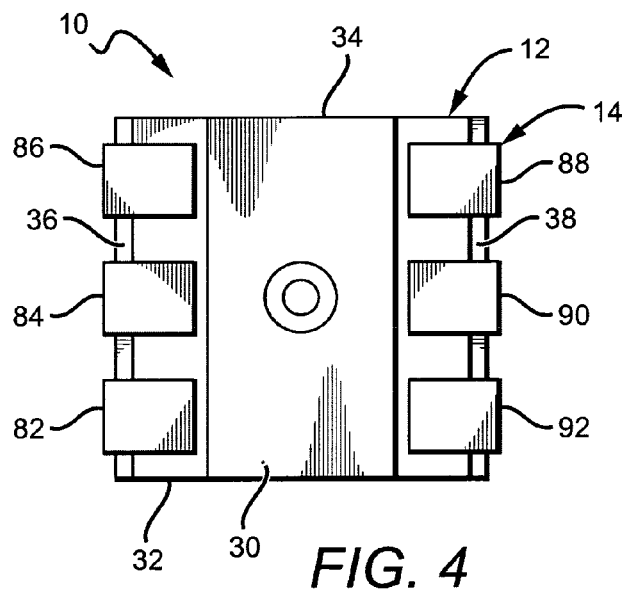
FIG. 4 is a bottom view of the embodiment shown in FIG. 1.
Figure 5:
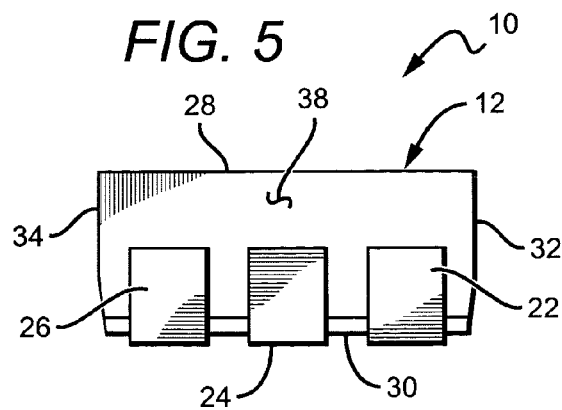

In the illustrative embodiment shown, the lead frame's anode and cathode parts 16, 18, 20, 22, 24, 26 project outwardly through the opposed surfaces 36 and 38 of the casing 12. As best shown in FIG. 4, anode parts 16, 18, 20 extend from surface 36, and cathode parts 22, 24, 26 extend from surface 38. The anode and cathode parts are arranged to operate in pairs to conduct an electrical signal to their respective light emitter when the package 10 is surface mounted for operation. In the embodiment shown, the anode and cathode parts 16, 18, 20, 22, 24, 26 are bent orthogonally to extend outside of and down along their end surfaces 36 and 38 of the casing, then bent orthogonally again to form end portions 82, 84, 86, 88, 90, 92 that extend along the lower surface 30 of the casing 12. The outwardly facing surfaces of the end portions 82, 84, 86, 88, 90, 92 of the leads are substantially flush to facilitate connection to an underlying substrate. As best shown in FIG. 3, the end portions 82, 84, 86, 88, 90, 92 (with only end portions 86, 88 being visible) of the leads can electrically connected or bonded to traces or pads on the substrate 94 using any of a number of well-known connection techniques, including soldering. It is understood that in other embodiments all or some of the end portions 82, 84, 86, 88, 90, 92 can be bent in an opposite direction while still allowing for surface mounting.

The cathode parts 22, 24, 26 comprise central surfaces or mounting pads 68, 70, 72 for carrying the LED chips 50, 52, 54 in a linear array that extends in a direction 74 perpendicular to the side surfaces 32 and 34, with the LEDs 50, 52, 54 being aligned generally along a central axis of the casing 12. This alignment allows for improved color uniformity at different viewing angles compared to packages having LEDs arranged in other ways, such as in a cluster.

Mounting pads 68 and 78 extend toward the center of the casing 12, which allows for the LEDs 50, 54 to be mounted closer to the center of the casing 12 so that they can emit out of the cavity 40. The anode parts 16, 18, 20 include electrical connection pads 76, 78, 80, respectively, positioned adjacent to, but spaced apart from, the mounting pads 68, 70, 72. Connection pads 76 and 80 extend toward the center of the casing 12 to allow for electrical connection to LED 50, 54 that are mounted closer to the center of the casing 12 by extensions of mounting pads 68, 70.

Figure 2:
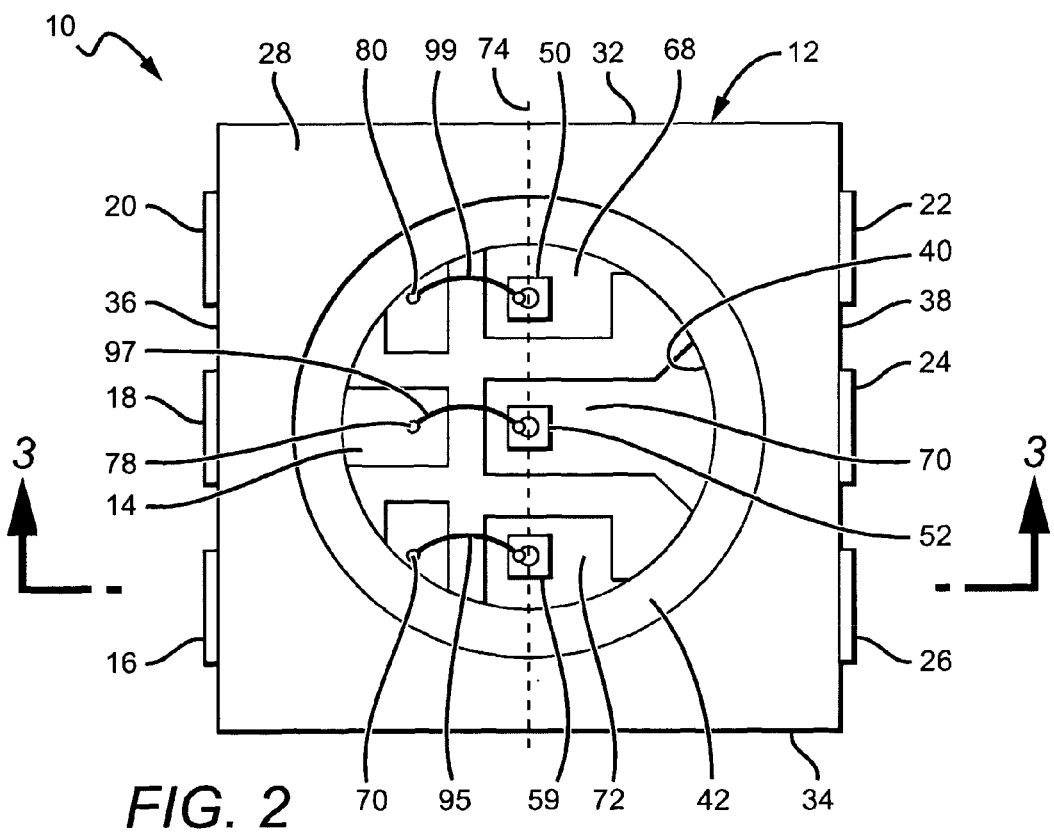
FIG. 2 is a top plan view of the embodiment shown in FIG. 1.

The anode parts 16, 18, 20 run generally parallel to one another and cathode parts 22, 24, 26 run generally parallel to one another other, with all extending in a direction perpendicular to the direction 74 of the linear LED array. The leads can have different widths and can be small enough that when the package 10 is viewed from the top, they are minimally visible or not visible. Additionally and/or alternatively, the leads may be obstructed from view from the top by the casing 12. As best seen in FIGS. 1 and 2, the cavity 40 extends into the casing interior a sufficient depth to expose the attach and connection pads 68, 70, 72, 76, 78, 80. In a preferred embodiment, each of the LEDs 50, 52, 54 has its own pair of contacts or electrodes arranged so that when an electrical signal is applied across the contacts the LED emits light. The contacts of the LEDs are electrically connected to an anode and cathode part pair. Ensuring that each of the LEDs 50, 52, 54 has its own cathode and anode pair is advantageous for many reasons, such as providing easier electrical control of each LED. In accordance with a typical implementation of the embodiments shown, one of the contacts of LEDs 50, 52, 54 is coupled to the chip carrier pads 68, 70, 72 while the other of LED contacts is coupled, respectively, to the pads 76, 78, 80. Different known structures and methods can be used for making this connection, with one such structure being wire bonds 95, 97, 99 applied using known methods.

The anode parts 16, 18, 20 and cathode parts 22, 24, 26 may be made from an electrically conductive metal or metal alloy, such as copper, a copper alloy, and/or other suitable low resistivity, corrosion resistant materials or combinations of materials. As noted, the thermal conductivity of the leads may assist, to some extent, in conducting heat away from the LEDs 50, 52, 54 carried by the SMD as shown by the arrow 98. As best shown in FIG. 7, to further assist in thermal dissipation the anode part 18 and cathode part 24 can comprise an enlarged portion near casing's edge. These enlarged portions provide increased surface area to spread the heat generated by the LEDs 50, 52, 54.

Each of the LEDs 50, 52, 54 may be electrically coupled with its one the pads 68, 70, 72 by means of an electrically and thermally conductive bonding material 100 such as a solder, adhesive, coating, film, encapsulant, paste, grease and/or other suitable material. In a preferred embodiment, the LEDs may be electrically coupled and secured to their respective pads using a solder pad on the bottom of the LEDs such that the solder is not visible from the top. The fabrication of the connector parts 16, 18, 20 and carrier parts 22, 24, 26 may be accomplished by stamping, injection molding, cutting, etching, bending or through other known methods and/or combinations of methods to achieve the desired configurations. For example, the connector parts and/or carrier parts can be partially metal stamped (e.g., stamped simultaneously from a single sheet of relevant material), appropriately bent, and finally fully separated or fully separated following the formation of some or all of the casing.

In some methods of manufacturing the LEDs may be coupled to the pads 68, 70, 72 prior to molding and/or assembling the casing 12 about the connection pads. Alternatively, the LEDs may be coupled to the pads 68, 70, 72 after the anode and cathode parts have been partially encased within the casing. The cavity 40 that extends into the casing may be configured so that sufficient portions of the pads 68, 70, 72 and pads 76, 78, 80 are exposed to receive the LEDs and the associated wire bonds, and to allow the LEDs to emit light out through the cavity 40.

In conventional packages, the smooth surfaces between the lead frame's anode parts 16, 18, 20 and cathode parts 22, 24, 26 and the upper and lower portions of the casing 12 make reliable adhesion difficult. These mating smooth surfaces can reduce the rigidity of the emitter package and can increase the chances of component failure by separation of the casing from the lead frame. The smooth surfaces can also allow for a seepage path for moisture to enter the casing. This also result in component failure and can reduce the ability of the emitter package to be used in applications requiring waterproof operation. To increase the adhesion reliability and rigidity and to allow for waterproof operation, one or more of the anode parts 16, 18, 20 and cathode parts 22, 24, 26 may further include one or more indentations, through-holes, apertures, extensions, and/or other features that contribute to the stability, integrity and/or robustness of the SMD package. These features may also enable the casing 12 and/or fill material 48 to bind better to the lead frame 14, which prevents moisture from infiltrating the device and allows for a waterproof utilization.

As best shown in FIGS. 7 and 9, anode parts 16, 18, 20 and cathode parts 22, 24, 26 may include respective through-holes 102, 104, 106, 108, 110, 112 that are located generally on the top surface of the lead frame. As best shown in FIGS. 7 and 10, the anode and cathode parts may also contain features such as V-cuts 114 located adjacent to the through-holes. The V-cuts 114 can be on the upper and lower surfaces of the anode parts 16, 18, 20 and cathode parts 22, 24, 26. The through-holes 102, 104, 106, 108, 110, 112, V-cuts 114, indentations, and/or other such features of the leads cooperate with the casing and/or fill material, at least in part, to enhance the structural stability and integrity of the package 10. In some implementations, the casing material and/or fill material extends at least partially into and/or through one or more of the through-holes 102, 104, 106, 108, 110, 112 formed in the leads to add rigidity. The casing and/or fill material can also fill the V-cuts to add rigidity and to block seepage of liquids to the interior of the package 10.

Referring now to FIG. 7, to further enhance the rigidity of the package 10 and to increase the reliability of the bond between casing 12 and the lead frame 14, the anodes parts 16, 20 and cathode parts 22, 26 can have side indentations 115 such that they have a wave shape. When the package 10 is fabricated, the casing material fills the indentations with the hardened casing material cooperating with the indentations to hold the casing 12 to the lead frame. Similarly, anode part 18 and cathode part 24 have side tabs 117 that also cooperate with the hardened casing or fill material to hold the casing 12 to the lead frame 14.

Figure 12:
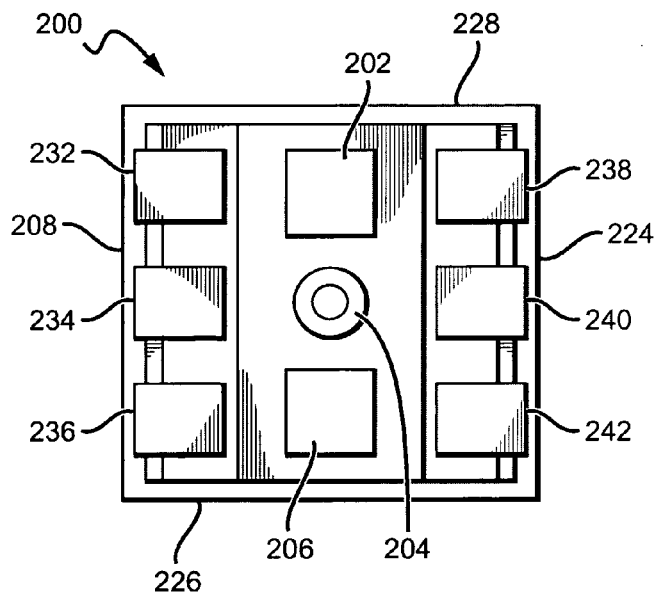
FIG. 12 is a bottom view of the embodiment shown in FIG. 11.

FIGS. 11-13 show another embodiment of an emitter package 200 according to the present invention that can also be surface mounted. The package 200 is similar in most respects to the package 10 shown in FIGS. 1-8, and described above except that thermally conductive bodies 202, 204, 206 have been included. The bodies 202, 204, 206 are arranged in the casing 208 to provide a thermally conductive path from the LEDs to the casing's lower surface. The bodies can then be further arranged in thermal communication with one or more heat spreaders to efficiently dissipate the heat from the LEDs. The package 200 can be used with many different heat spreaders arranged in many different ways.

The thermally conductive bodies 202, 204, 206, can have many shapes and sizes and can comprise, for example, a rectangular block or a cylinder extending, vertically and at least partially through the casing 208. In the embodiment shown, the bodies 202, 204, 206 extend through the casing 208 from the surface having the LEDs to the casing's lower surface 212. As best shown in FIG. 11, the bottom surface of conductive body 204 is exposed at the lower surface 212 through an aperture 210 in the lower surface 212 and disposed substantially flush with the lower surface 212. The bodies 202 and 206 can also be exposed at the bottom surface as shown in FIG. 12. The bottom surfaces of the bodies are arranged in heat transfer relationship with a heat spreader or dissipater 214 carried by a substrate 216 such as printed wiring or a circuit board. Thermally conductive bodies, given their relatively substantial mass and cross section area normal to the direction of heat flow, can serve as an efficient heat sink providing a low thermal resistance path (arrows 218) between the heat-generating LEDs carried by the carrier pads and the heat spreader 214. Some heat is also dissipated along the leads (arrow 220).

Like the package 10, the package 200 shown in FIGS. 11-13 comprises a preferably dark or black ceramic casing 208 comprising opposed upper and lower surfaces 222, 212, side surfaces 208, 224 and end surfaces 226, 228. The SMD 200 carries a lead frame 230 comprising, as before, three anode parts, three cathode parts. However, as with the above preferred embodiment, it is understood that any number of connection parts, carrier parts and other lead frame portions may be used in a desired application without departing from the scope of the present invention. The chip carrier parts 218 comprise a surface or pad for receiving LED chips, typically comprising red, green and blue LEDs, other various other LED color may also be used. As before, the connection parts include enlarged wire bond pads positioned in the region adjacent to, but spaced apart from, the chip carrier parts.

As before, the leads are bent orthogonally to extend along and outside of their respective casing end surfaces, then bent orthogonally again so that end portions 232, 234, 236, 238, 240, 242 of the leads extend along the bottom surface 212 of the casing. The outwardly facing surfaces of the end portions 232, 234, 236, 238, 240, 242 of the leads are electrically connected or bonded to traces or pads on a substrate 216, typically a printed circuit board, using any of a number of well known connection techniques. As before, the casing has a cavity 244 that extends a sufficient depth to expose the pads of the connection parts and carrier parts. The connection parts and carrier parts are preferably made from an electrically conductive sheet metal or sheet metal alloy cut from sheet metal stock by means of punch press operations and then bent into their final configuration either before or after the formation of the casing about the lead frame.

Each of the LEDs has a pair of electrical terminals or electrodes, the cathodes of which are electrically coupled to the carrier pads while the anodes of the LEDs are coupled, respectively, to the pads of the separate connection parts by single wire bonds.

Figure 14:
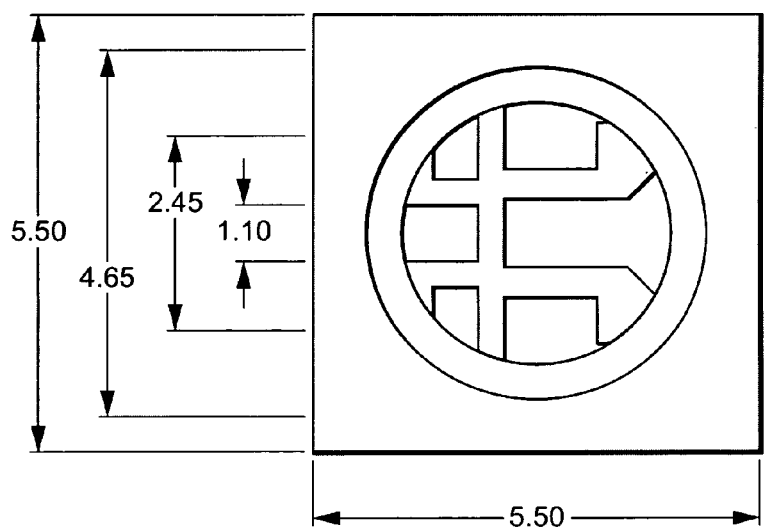
FIG. 14 is a top dimensional view of one embodiment of a surface mount device according to the present invention.
Figure 16:
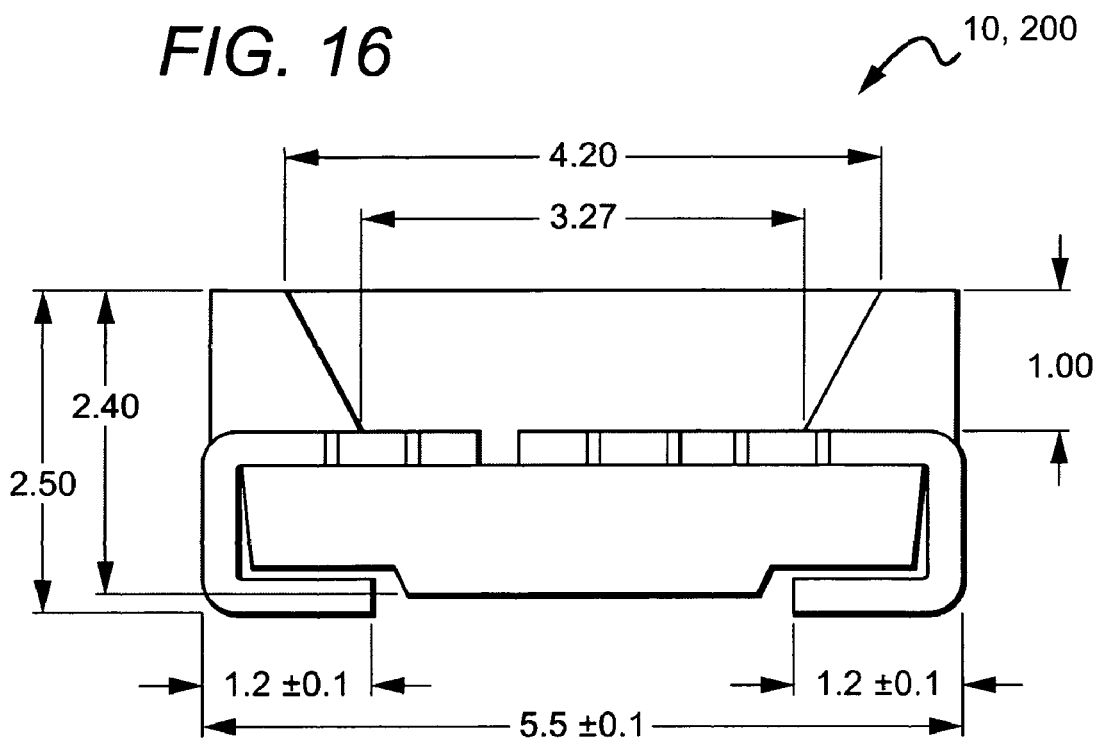
FIG. 16 is a front side dimensional view of the embodiment shown in FIG. 15.

With reference now to FIGS. 14-16, some examples of dimensional characteristics of the various components of an SMD 10 or 200 are shown. By way of example and not limitation, the SMD 10 or 200 may have an overall length of ~5.50 mm, an overall width of ~5.50 mm, and a height of ~2.50 mm.

Figure 17:
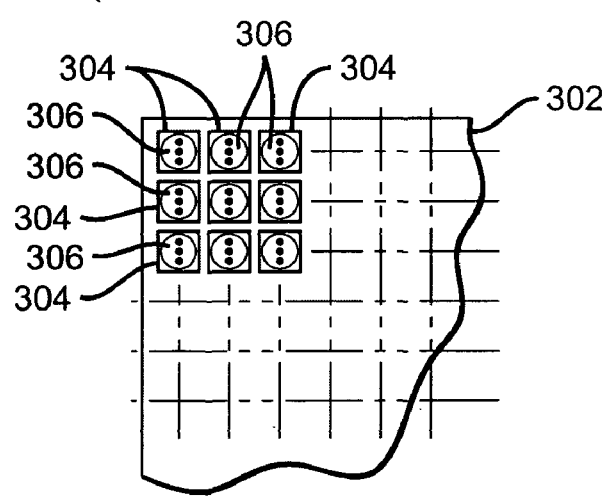
FIG. 17 is a front elevation view of a portion of an LED display screen incorporating surface mount devices in accordance with embodiments of the present invention.

With reference to FIG. 17, there is shown in schematic form a portion of an LED display screen 300, for example, an indoor and/or outdoor screen comprising, in general terms, a driver PCB 302 carrying a large number of surface-mount devices 304 arranged in rows and columns, each SMD defining a pixel. The SMDs 304 may comprise devices such as the embodiments shown in FIGS. 1-8, and 11-13. The SMD devices 304 are electrically connected to traces or pads on the PCB 302 connected to respond to appropriate electrical signal processing and driver circuitry (not shown). As disclosed above, each of the SMDs carries a vertically oriented, linear array 306 of red, green and blue LEDs. Such a linear orientation of the LEDs has been found to improve color fidelity over a wide range of viewing angles.

While several illustrative embodiments of the invention have been shown and described, numerous variations and alternate embodiments will occur to those skilled in the art, such as utilizing the present invention for LED decorative lighting or the like. Such variations and alternate embodiments are contemplated, and can be made without departing from the spirit and scope of the invention as defined in the appended claims.

We claim:

1. An emitter package, comprising:
   a casing comprising a cavity extending into the interior of said casing from a top surface of said casing; and a lead frame integral to said casing, said lead frame comprising a plurality of electrically conductive carrier parts each holding at least one of a plurality of light emitting devices, said light emitting devices arranged in linear alignment and emitting out said cavity, said lead frame also allowing for an electrical signal to be applied to said light emitting devices through said lead frame, wherein said lead frame further comprises through-holes and V-cuts, wherein said V-cuts are disposed into said lead frame on planes running generally perpendicular to the surface of said lead frame, wherein at least some of said through-holes intersect with at least some of said V-cuts, said holes and cuts fitting with said casing;

wherein each of said carrier parts further comprises an integral thermally conductive body extending at least partially through to the bottom of said casing.

2. The emitter package of claim 1, wherein said light emitting devices comprise LEDs, which are adapted to be energized to produce in combination a substantially full range of colors.

3. The emitter package of claim 1, wherein said lead frame is arranged to allow for surface mounting of said package.

4. The emitter package of claim 1, wherein said V-cuts are disposed on both sides of said lead frame.

5. The emitter package of claim 1, wherein said lead frame comprises a plurality of electrically conductive cathode parts each having an attach pad for carrying at least one of said light emitting devices, each said attach pad being electrically coupled to its one of said light emitting devices, and a corresponding plurality of electrically conductive anode parts separate from each said cathode part, each of said anode parts having a connection pad arranged to allow electrical connection to one of said light emitting devices, wherein said attach pads and connection pads are arranged to hold light emitting devices in linear alignment.

6. The device of claim 5, wherein each of said light emitters is electrically coupled to each of said connection pads by a wire bond.

7. The emitter package of claim 1, wherein said lead frame further comprises a side indentation.

8. The emitter package of claim 7, wherein said side indentation cooperates with said casing.

9. The emitter package of claim 1, wherein said cavity is at least partially filled with a fill material.

10. The emitter package of claim 9, wherein said through-holes and V-cuts are at least partially filled by said fill material.

11. The emitter package of claim 9, wherein said lead frame further comprises a side indentation cooperating with said fill material.

* * * * *